United States Patent
Yamagishi et al.

(10) Patent No.: US 9,615,458 B2
(45) Date of Patent: Apr. 4, 2017

(54) THREE-DIMENSIONAL CIRCUIT COMPONENT, METHOD OF MAKING THE SAME, AND PHYSICAL-QUANTITY MEASURING INSTRUMENT

(71) Applicant: NAGANO KEIKI CO., LTD., Tokyo (JP)

(72) Inventors: Nobutaka Yamagishi, Tokyo (JP); Naoki Yamashita, Tokyo (JP); Atsushi Imai, Tokyo (JP)

(73) Assignee: NAGANO KEIKI CO., LTD., Tokyo (JP)

( * ) Notice: Subject to any disclaimer, the term of this patent is extended or adjusted under 35 U.S.C. 154(b) by 499 days.

(21) Appl. No.: 13/941,630

(22) Filed: Jul. 15, 2013

(65) Prior Publication Data

US 2014/0022735 A1 Jan. 23, 2014

(30) Foreign Application Priority Data

Jul. 17, 2012 (JP) ................................. 2012-158497

(51) Int. Cl.
*H05K 1/16* (2006.01)
*H05K 3/34* (2006.01)
*H05K 1/02* (2006.01)

(52) U.S. Cl.
CPC ............. *H05K 1/16* (2013.01); *H05K 1/0284* (2013.01); *H05K 3/34* (2013.01); *H05K 3/3442* (2013.01);
(Continued)

(58) Field of Classification Search
CPC ........ H05K 1/0298; H05K 1/14; H05K 1/144; H05K 1/145; H05K 1/185; G01L 19/0084; G01L 19/0007; G01L 19/147; G01L 19/148
(Continued)

(56) References Cited

U.S. PATENT DOCUMENTS 5,495,089 A 2/1996 Freedman et al.
5,570,274 A * 10/1996 Saito ..................... H01L 23/053
174/260
(Continued)

FOREIGN PATENT DOCUMENTS

CN 101688814 3/2010
JP 06-209151 7/1994
(Continued)

OTHER PUBLICATIONS

Japanese Office Action with English translation dated Nov. 11, 2014, 5 pages.
(Continued)

*Primary Examiner* — Courtney Smith
*Assistant Examiner* — Christopher L Augustin
(74) *Attorney, Agent, or Firm* — Rankin, Hill & Clark LLP (57) ABSTRACT

For producing a three-dimensional circuit component, an electronic component is mounted on a synthetic resin block. A plurality of electrically-conductive patterns used to establish an electrical connection to the electronic component are formed on the block along a three-dimensional shape of the block. An end of each electrically-conductive patterns is provided with a solder-disposed section. A solder is provided between the solder-disposed section and an opposed surface of the electronic component. The section of each electrically-conductive patterns other than the solder-disposed section and a section on which the electronic component is mounted is internally formed in the block. Since the section of each electrically-conductive patterns other than the section on which the electronic component is mounted is internally formed in the block, the electrically-conductive patterns are not unnecessarily exposed.

7 Claims, 8 Drawing Sheets

(52) U.S. Cl.
CPC ............ *H05K 2201/0999* (2013.01); *H05K 2201/09118* (2013.01); *Y10T 29/49144* (2015.01)

(58) Field of Classification Search
USPC ....... 361/730, 733, 736, 739, 743, 749, 750, 361/751, 760, 765, 767, 777; 73/73, 715, 73/756; 174/523, 521, 524, 564
See application file for complete search history.

(56) References Cited

U.S. PATENT DOCUMENTS

| | | | |
|---|---|---|---|
| 6,376,769 B1* | 4/2002 | Chung | B32B 3/08 174/260 |
| 7,972,650 B1 | 7/2011 | Church et al. | |
| 2005/0023033 A1* | 2/2005 | Saiki | H05K 3/305 174/260 |
| 2006/0090566 A1* | 5/2006 | Oda | G01L 23/18 73/715 |
| 2010/0151735 A1* | 6/2010 | Crutcher | H01R 4/5083 439/620.01 |
| 2010/0192696 A1* | 8/2010 | Schlitzkus | G01L 19/148 73/756 |

FOREIGN PATENT DOCUMENTS

| | | |
|---|---|---|
| JP | 09-288004 | 11/1997 |
| JP | 11-265748 | 9/1999 |
| JP | 2000-151071 | 5/2000 |
| JP | 2007-081086 | 3/2007 |
| JP | 2010-533284 | 10/2010 |

OTHER PUBLICATIONS

European Search Report, Application No. EP 13176742.8, dated Nov. 18, 2013, 5 pages.
Chinese Office Action with English translation dated May 18, 2016, 13 pages.

* cited by examiner

THREE-DIMENSIONAL CIRCUIT COMPONENT, METHOD OF MAKING THE SAME, AND PHYSICAL-QUANTITY MEASURING INSTRUMENT

The entire disclosure of Japanese Patent Application No. 2012-158497 filed Jul. 17, 2012 is expressly incorporated by reference herein.

BACKGROUND OF THE INVENTION

1. Field of the Invention

The present invention relates to a three-dimensional circuit component, a method of making the three-dimensional circuit component, and a physical-quantity measuring instrument with the three-dimensional circuit component.

2. Description of Related Art

A three-dimensional circuit component is usable in electronic devices, physical-quantity measuring instruments and other devices.

A typical example of a physical-quantity measuring instrument using a three-dimensional circuit component is, for instance, an infrared detector in which electronic components such as an IC chip and a capacitor are mounted on a block integrally formed from a synthetic resin and a three-dimensional circuit is formed using an MID molding substrate technique in order to establish an electrical connection of the electronic components and terminals or the like (Patent Literature 1: U.S. Pat. No. 3,211,074).

In the infrared detector of Patent Literature 1, the three-dimensional circuit includes adjacent electrically-conductive patterns that are formed on a surface of the resin block to be exposed.

In the typical arrangement described in Patent Literature 1, since the electrically-conductive patterns of the three-dimensional circuit are exposed outside, problems such as a short-circuit and a decrease in withstand voltage are likely to be caused when a foreign substance contacts with adjacent ones of the electrically-conductive patterns.

When the block on which the three-dimensional circuit and the electronic components are provided is covered by a metal case, the block and the metal case need to be sufficiently distanced from each other for avoiding contact between the electrically-conductive patterns and the metal case, which results in an increase in the device size.

SUMMARY OF THE INVENTION

An object of the present invention is to provide a three-dimensional circuit component designed to have an unexposed circuit portion for preventing a decrease in withstand voltage, a method of making the three-dimensional circuit component, and a physical-quantity measuring instrument.

According to an aspect of the invention, a three-dimensional circuit component includes: a resin block; an electronic component being mounted on the block; and a plurality of electrically-conductive patterns being formed along a three-dimensional shape of the block in order to establish an electrical connection to the electronic component, the electrically-conductive patterns each having an end that serves as a contact portion opposed to the electronic component to electrically contact with the electronic component, in which a solder is provided between a surface of the electronic component opposed to one of the electrically-conductive patterns and a solder-disposed section provided in the contact portion of each of the electrically-conductive patterns, and a section of each of the electrically-conductive patterns other than the solder-disposed section and a section on which the electronic component is mounted is internally formed in the block.

With the above arrangement, the solder is provided between the opposed surface of the electronic component opposed to one of the electrically-conductive patterns and the solder-disposed section of the end of each of the electrically-conductive patterns, thereby electrically connecting the electronic component to the one of the electrically-conductive patterns.

The section of each of the electrically-conductive patterns other than the solder-disposed section and the section on which the electronic component is mounted is internally formed in the block, so that the electrically-conductive patterns are not unnecessarily exposed.

Thus, since a foreign substance is prevented from contacting with adjacent ones of the electrically-conductive patterns, a short-circuit and a decrease in withstand voltage can be prevented.

According to another aspect of the invention, a method of making the three-dimensional circuit component includes: forming a three-dimensional circuit by internally forming the electrically conductive patterns, except the ends thereof, in the block; mounting the electronic component on the end of one of the electrically-conductive patterns on which the solder is applied; and soldering the electronic component by heating the block with the electronic component mounted thereon to melt the solder between the end of the one of the electrically-conductive patterns and the electronic component for fixation of the electronic component.

With the above arrangement, since the surfaces of the electrically-conductive patterns are covered by the resin, even when the solder overspills, the solder is prevented from contacting with adjacent ones of the electrically-conductive patterns.

Thus, the three-dimensional circuit component that can provide the above advantages can be produced in a facilitated manner.

In the above aspect, it is preferable that an insert molding is used for forming the three-dimensional circuit.

With the above arrangement, the three-dimensional circuit can be formed during production of the block, which results in an improved production efficiency and thus in a reduced production time of the three-dimensional circuit component.

In the above aspect, it is preferable that during forming the three-dimensional circuit, the block is formed by forming the electrically-conductive patterns on a surface of a resin block body and covering each of the electrically-conductive patterns, except the end thereof, with a resin covering piece.

For the above arrangement, an MID (Molded Interconnect Device) molding can be employed for producing the three-dimensional circuit component. With the MID molding, it is possible to form even complicated electrically-conductive patterns in a facilitated manner.

After formation of the electrically-conductive patterns, the resin covering piece is provided on the block body except the ends of the electrically-conductive patterns (i.e., the solder-disposed sections) to produce the block. Since the electrically-conductive patterns are not unnecessarily exposed, a foreign substance is prevented from contacting with adjacent ones of the electrically-conductive patterns to cause a short-circuit.

According to another aspect of the invention, a physical-quantity measuring instrument includes: the three-dimensional circuit component; a sensor module that is disposed near a first end of the three-dimensional circuit component and outputs a signal to the electronic component; and a contact member that is disposed near a second end of the three-dimensional circuit component opposite to the first end and enables a signal transmission and reception between the electronic component and an external device, in which the three-dimensional circuit component further includes: a plate on which the electronic component is mounted; and ribs being formed on both sides of the plate.

With the above arrangement, the electrically-conductive patterns are unexposed. Thus, even when a periphery of the three-dimensional circuit component is covered by a case, the block can be placed close to the case without worrying about occurrence of a short-circuit between the block and the case, so that the physical-quantity measuring instrument can be downsized. Further, the plate can be thinned, so that the instrument can be downsized as a whole even after the electronic component is mounted on the plate. Since such a thinned plate can have a small through hole formed therethrough, patterns having a narrow pitch can be formed.

Since the ribs formed on the plate serve to reinforce the three-dimensional circuit component, the strength of the instrument can be increased as a whole.

In the above aspect, it is preferable that the contact member includes a coil being brought into contact with the external device.

With the above arrangement, the instrument can be stably connected to the external device.

In the above aspect, it is preferable that the physical-quantity measuring instrument further includes: a contact member housing that is connected to the second end of the three-dimensional circuit component to enclose the contact member, the contact member housing including: a step portion having a step relative to a flat surface of the plate; and a pad that is provided on a flat surface of the step portion and is electrically connected to the electrically-conductive patterns, in which the contact member further includes a linear portion that is formed integrally with the coil and is in contact with a flat surface of the pad over a predetermined length, and the pad and the linear portion are fixed to each other by soldering.

With the above arrangement, the contact member can be electrically connected to the pad in a facilitated manner. Since the step portion has the step relative to the plate on which the electronic component is mounted, the plate can be kept thin.

In the above aspect, it is preferable that the physical-quantity measuring instrument further includes: a metal module housing that encloses the sensor module; and a cylindrical portion being connected to the module housing, the cylindrical portion being provided with a ground lead formed on an outer circumference thereof, the cylindrical portion being provided with a step formed on an end thereof, in which the step and the module housing are connected to each other by a bonding member.

With the above arrangement, the step is formed on the cylindrical portion. Since the bonding member is provided in the step, an overspill of the bonding member is prevented, which results in facilitating an assembly operation of the instrument. Further, an additional member is not required for grounding.

DESCRIPTION OF EMBODIMENT(S)

An exemplary embodiment of the invention will be described below with reference to the attached drawings.

Figure 1:
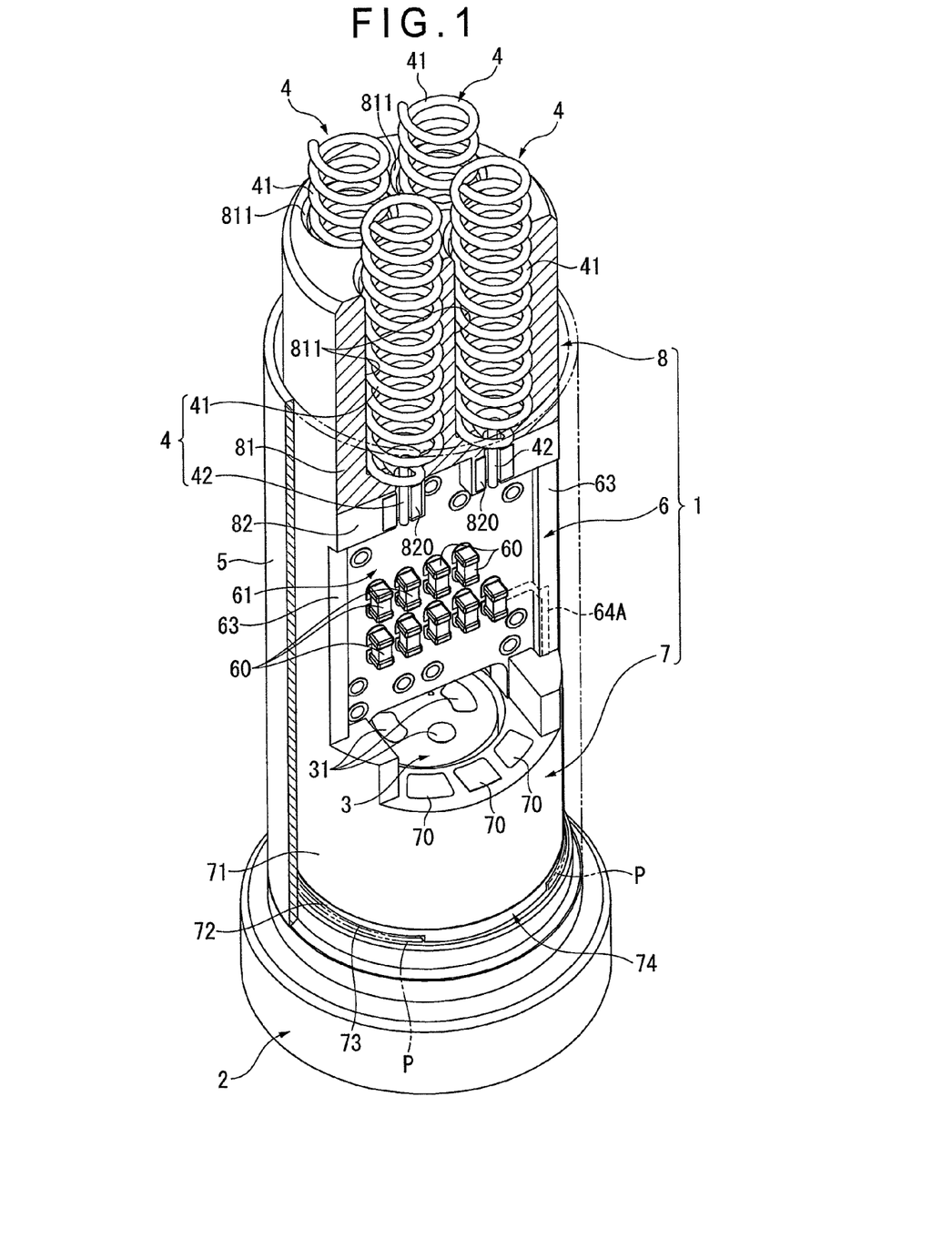
FIG. 1 is a partially cutaway perspective view of a physical-quantity measuring instrument according to an exemplary embodiment of the invention.
Figure 2:
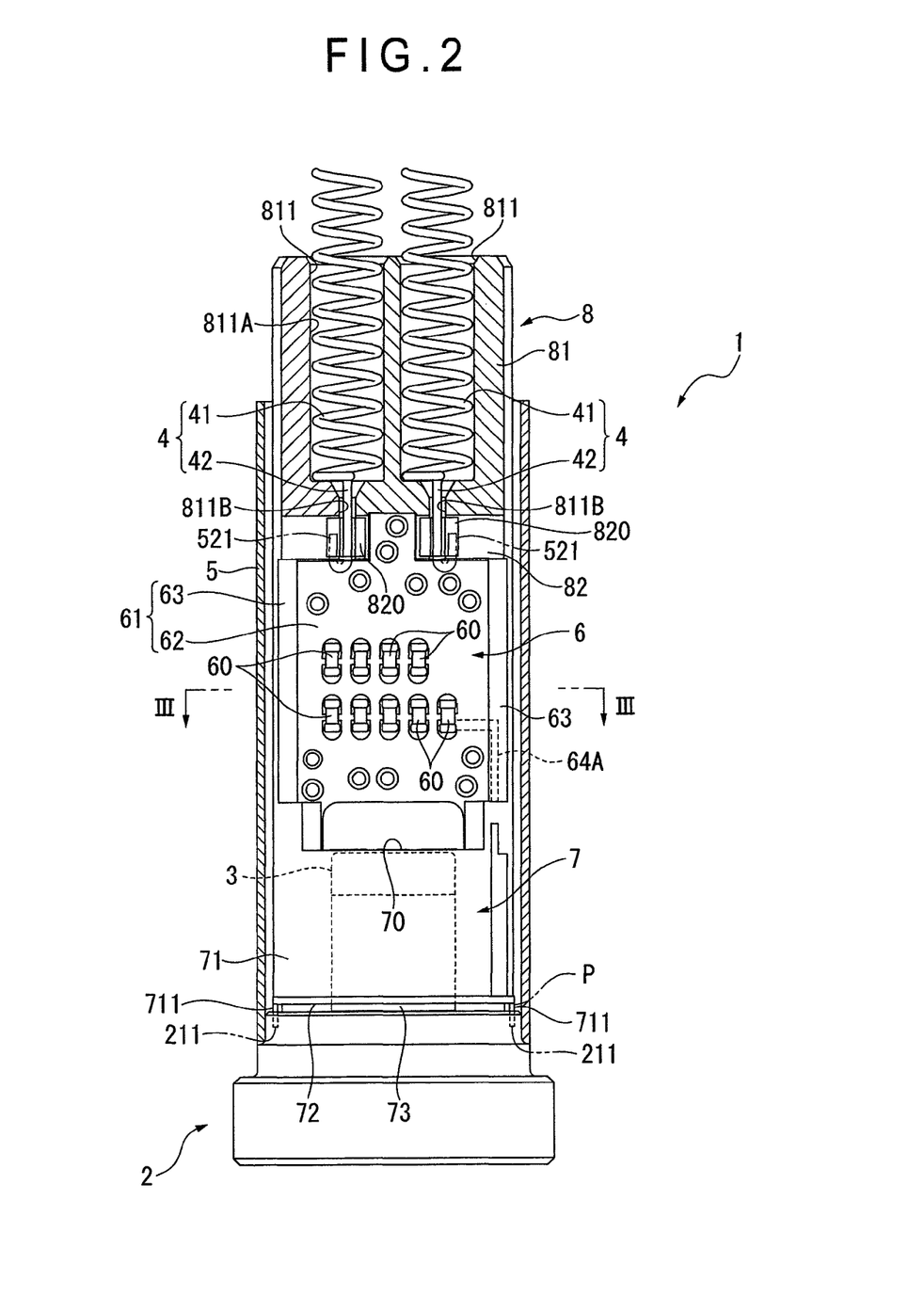
FIG. 2 is a partially cutaway front view of the physical-quantity measuring instrument.

Each of FIGS. 1 and 2 shows the whole arrangement of a physical-quantity measuring instrument according to the exemplary embodiment.

As shown in FIGS. 1 and 2, the physical-quantity measuring instrument is provided by a pressure measuring instrument that includes: a substantially cylindrical body 1 that is made of a synthetic resin and has opposite first and second ends; a metal module housing 2 being provided at the first end of the body 1; a sensor module 3 being provided in the module housing 2; at least one contact member 4 being provided at the second end of the body 1; and a cylindrical metal case 5 that covers an outer circumference of the body 1.

The body 1 includes: a three-dimensional circuit component 6 that has opposite first and second ends; a cylindrical portion 7 being integrally formed on the first end of the three-dimensional circuit component 6 to be connected to the module housing 2; and a contact member housing 8 being integrally formed on the second end of the three-dimensional circuit component 6 to enclose the contact member 4.

Figure 3:
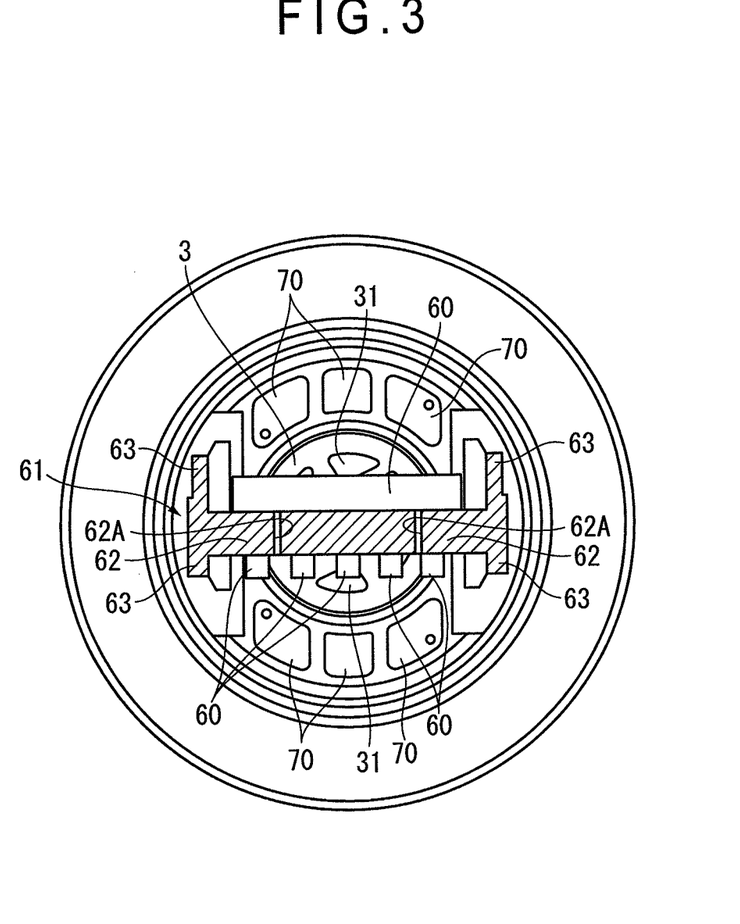
FIG. 3 is a sectional view taken along a line III-III in FIG. 2.

FIG. 3 is a sectional view taken along the line III-III in FIG. 2.

As shown in FIG. 3, the three-dimensional circuit component 6 includes an insulating synthetic resin block 61 on which at least one electronic component 60 is mounted. The block 61 includes: a plate 62; and ribs 63 that extend in a plate-thickness direction of the plate 62 at the four corners of the plate 62.

The electronic components are mounted on both front and back surfaces of the plate 62. In FIG. 3, relatively small ones of the electronic components 60 are mounted on the front surface of the plate 62 and relatively large ones of the electronic components 60 are mounted on the back surface of the plate 62. Through holes 62A are formed through the plate 62 at plural positions to establish an electrical connection between the electronic components 60 on the front surface and the electronic components 60 on the back surface.

A length of the ribs 63 (a dimension defined in a projecting direction from the front or back surface of the plate 62) is larger than a thickness of the electronic components 60.

As shown in FIGS. 1 to 3, the module housing 2 is designed to serve as a joint for connection to an attachment member (not shown). The module housing 2 has a fluid inlet hole (not shown) formed therein and a top of the module housing 2 is connected to the sensor module 3.

The module housing 2 is partially enclosed in the cylindrical portion 7 of the body 1 and the sensor module 3 is exposed out of an end of the cylindrical portion 7. The cylindrical portion 7 includes a plurality of bonding pads 70 formed on an end surface where the sensor module 3 is exposed. The bonding pads 70 are connected to a detector 31 through bonding (not shown), the detector 31 being provided by a strain gauge provided on an end surface of the sensor module 3. With this arrangement, a pressure of a fluid entering the fluid inlet hole of the module housing 2 is detected by the detector 31 of the sensor module 3 and a detection signal is outputted to the electronic components 60.

A grounding lead 74 is formed on an outer circumference of the cylindrical portion 7 near the other end of the cylindrical portion 7. The grounding lead 74 is electrically connected to the electronic components 60 as required.

The cylindrical portion 7 includes: a large-diameter portion 71 having opposite first and second ends, the first end having a surface provided with the bonding pads 70; and a small-diameter portion 72 being integrally formed on the second end of the large-diameter portion 71. A step 73 is formed between the large-diameter portion 71 and the small-diameter portion 72. A recess is provided by the step 73 and an end surface of the module housing 2. A bonding member in a form of an electrically-conductive adhesive P is provided in the recess, thereby connecting the cylindrical portion 7 and the module housing 2 to each other and grounding the cylindrical portion 7 through the grounding lead 74 and the metal module housing 2.

A plurality of engagement pins 711 are formed on a surface of the second end of the large-diameter portion 71 of the cylindrical portion 7 to be engaged with engaging holes 211 formed on the end surface of the module housing 2.

The contact member 4, which is used for a signal transmission and reception between the electronic component 60 and an external device (not shown), includes: a coil 41; and a linear portion 42 being integrally formed on a base end of the coil 41.

A distal end of the coil 41 projects from an end surface of the contact member housing 8 and contacts with the external device (not shown).

The linear portion 42 extends along a longitudinal axis of the coil 41.

As shown by an imaginary line in FIG. 2, an end of the linear portion 42 may be provided with a folded portion 521. The folded portion 521 and the linear portion 42 are connected to each other in a U-shape. With this arrangement, the contact member 4 is prevented from easily falling out of the contact member housing 8, thereby facilitating a soldering operation (described later).

The contact member housing 8 includes: a columnar portion 81; and a step portion 82 being formed integrally with the columnar portion 81 and having a step relative to a flat surface of the plate 62.

The columnar portion 81 is provided with the same number of contact member insertion holes 811 as the contact member 4 (four contact member insertion holes are shown in FIGS. 1 and 2), the contact member insertion holes 811 being formed along an axial direction of the columnar portion 81. The contact member insertion holes 811 are disposed at regular intervals around a longitudinal axis of the contact member housing 8 and each include: a large hole 811A having a bottom surface on which the base end of the coil 41 of the contact member 4 is received; and a small hole 811B being formed continuously with the large hole 811A so that the linear portion 42 is inserted through the small hole 811B. The small hole 811B is tapered from an intermediate position thereof toward the large hole 811A. When the end of the linear portion 42 is provided with the folded portion 521, the small hole 811B is provided by an elongated hole so that the folded portion 521 and the linear portion 42 in the U-shape are inserted therein.

At least one pad 820 is provided on a flat surface of the step portion 82. An outer circumference of the linear portion 42 of the contact member 4 is in contact with the pad 820 over a predetermined length. The pad 820 and the linear portion 42 are fixed to each other by soldering (not shown). In order to increase a contact area between the linear portion 42 and the step portion 82, the step portion 82 may be provided with a recess formed along the axial direction of the columnar portion 81 so that the pad 820 is received in the recess.

Figure 4A:
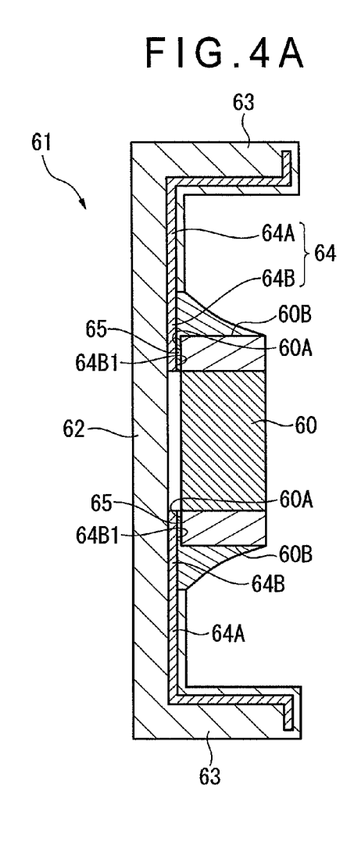
FIG. 4A is a sectional view schematically showing a three-dimensional circuit component.
Figure 4B:
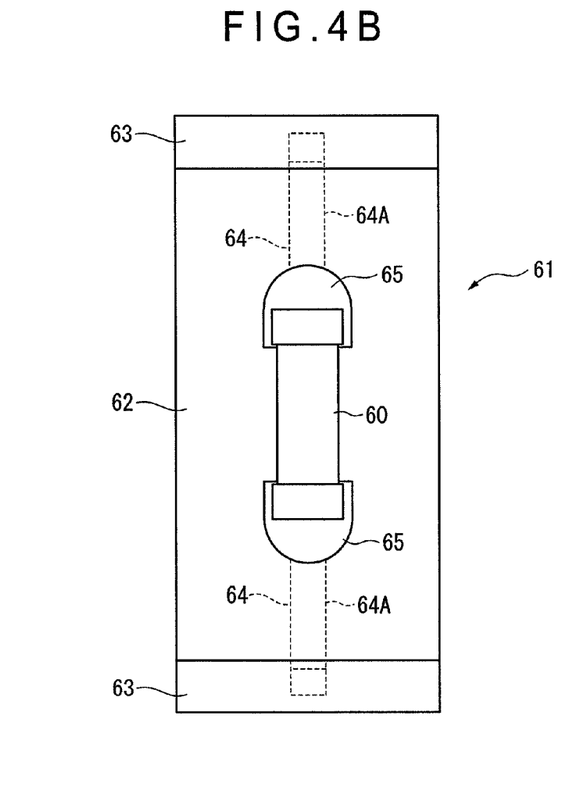
FIG. 4B is a front view schematically showing the three-dimensional circuit component.

FIG. 4A is a sectional view schematically showing the three-dimensional circuit component 6 and FIG. 4B is a front view schematically showing the three-dimensional circuit component 6. FIGS. 4A and 4B schematically show an arrangement in which one electronic component 60 is mounted on the block 61 and both sides of the plate 62 of the block 61 are provided with the ribs 63, respectively, the ribs 63 projecting from the front surface of the plate 62.

As shown in FIGS. 4A and 4B, for establishing an electrical connection to the electronic component 60, a plurality of electrically-conductive patterns 64 are continuously formed on the plate 62 and the ribs 63 of the block 61 along a three-dimensional shape of the block 61.

The electrically-conductive patterns 64 each include: a belt-like portion 64A; and a contact portion 64B that is formed at an end of the belt-like portion 64A. The contact portion 64B is opposed to the electronic component 60 and electrically contacts with the electronic component 60. The other end of the belt-like portion 64A is connected to the electrically-conductive pattern 64 connected to another electronic component 60, the sensor module 3 and/or the contact member 4 (not shown in FIGS. 4A and 4B).

The contact portion 64B is in a rectangular shape and is larger in width than the belt-like portion 64A in plan view. A solder-disposed section 64B1 is formed at the center of the contact portion 64B and an electronic component-disposed section 64B2, on which the electronic component 60 is to be mounted, is formed at the outer side of the solder-disposed section 64B1 (see FIG. 5B).

A solder 65 is provided between an opposed surface 60A of the electronic component 60 being opposed to one of the electrically-conductive patterns 64 and the solder-disposed section 64B1. The solder 65 may also cover a side surface 60B of the electronic component 60, the side surface 60B intersecting with the opposed surface 60A.

The section of each of the electrically-conductive patterns 64 other than solder-disposed section 64B1 and the electronic component-disposed section 64B2 is internally formed, i.e., embedded, in the block 61. In other words, only the solder-disposed section 64B1 and the electronic component-disposed section 64B2 of each of the electrically-conductive patterns 64 are exposed on the plate 62 of the block 61.

In the exemplary embodiment, the arrangement of the electrically-conductive patterns 64 of the three-dimensional circuit component 6 shown in FIGS. 4A and 4B is applied to the three-dimensional circuit component 6 of the physical-quantity measuring instrument shown in FIGS. 1 and 2.

As shown in FIGS. 1 and 2, the plurality of electronic components 60 are mutually connected through internally formed electrically-conductive patterns (not shown) and one of the electronic components 60 is connected to the belt-like portion 64A of one of the electrically-conductive patterns internally formed in the block 61. The belt-like portion 64A is connected to an end of an electrically-conductive pattern (not shown) internally formed in the cylindrical portion 7 and the other end of this electrically-conductive pattern is connected to one of the bonding pads 70. At least one of the plurality of the electronic components 60 is connected to an end of an electrically-conductive pattern (not shown) internally formed in the step portion 82 and the other end of this electrically-conductive pattern is connected to the pad 820. With this arrangement, in the exemplary embodiment, the pad 820, the electronic component 60 and the bonding pad 70 are connected not via an externally formed, i.e., exposed, conductive path but via the internally formed electrically-conductive patterns.

Next, a method of making the physical-quantity measuring instrument according to the exemplary embodiment will be described with reference to FIGS. 5A to 8. Production of the Three-dimensional Circuit Component First, a description will be made on a method of making the three-dimensional circuit component 6.
Three-dimensional Circuit Forming Process The electrically-conductive patterns 64, except the ends thereof, are internally formed in the block 61

Figure 5A:
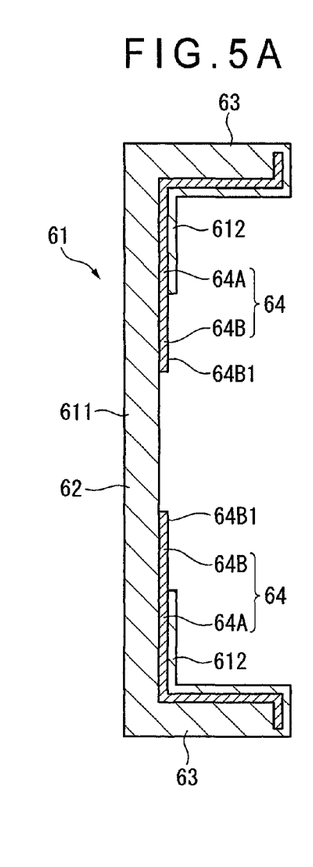
FIG. 5A is a sectional view schematically showing a block after formation of electrically-conductive patterns.
Figure 5B:
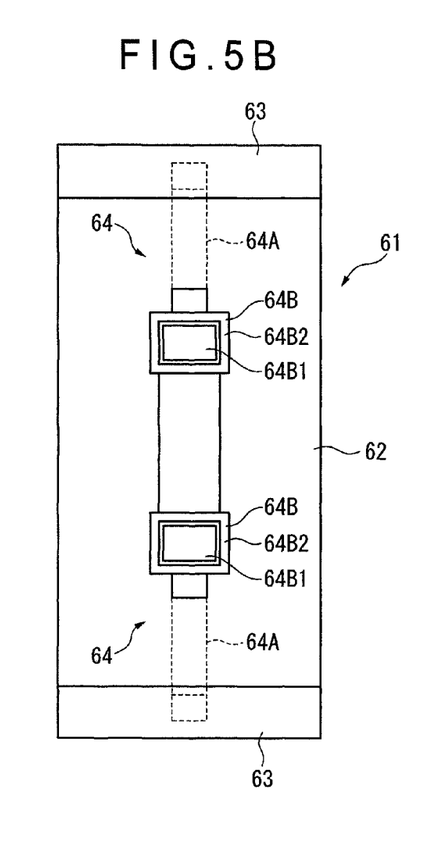
FIG. 5B is a front view schematically showing the block after formation of the electrically-conductive patterns.

FIGS. 5A and 5B schematically show the block after formation of the electrically-conductive patterns.

As shown in FIGS. 5A and 5B, except the ends of the electrically-conductive patterns 64, i.e., the solder-disposed sections 64B1 and the electronic component-disposed sections 64B2, the electrically-conductive patterns 64 are internally formed in the synthetic resin block 61. In other words, two of the belt-like electrically-conductive patterns 64 extend from the mutually opposed ribs 63 to the vicinity of the center of the plate 62 and the ends of the electrically-conductive patterns 64 and a portion therebetween are exposed.

Figure 6:
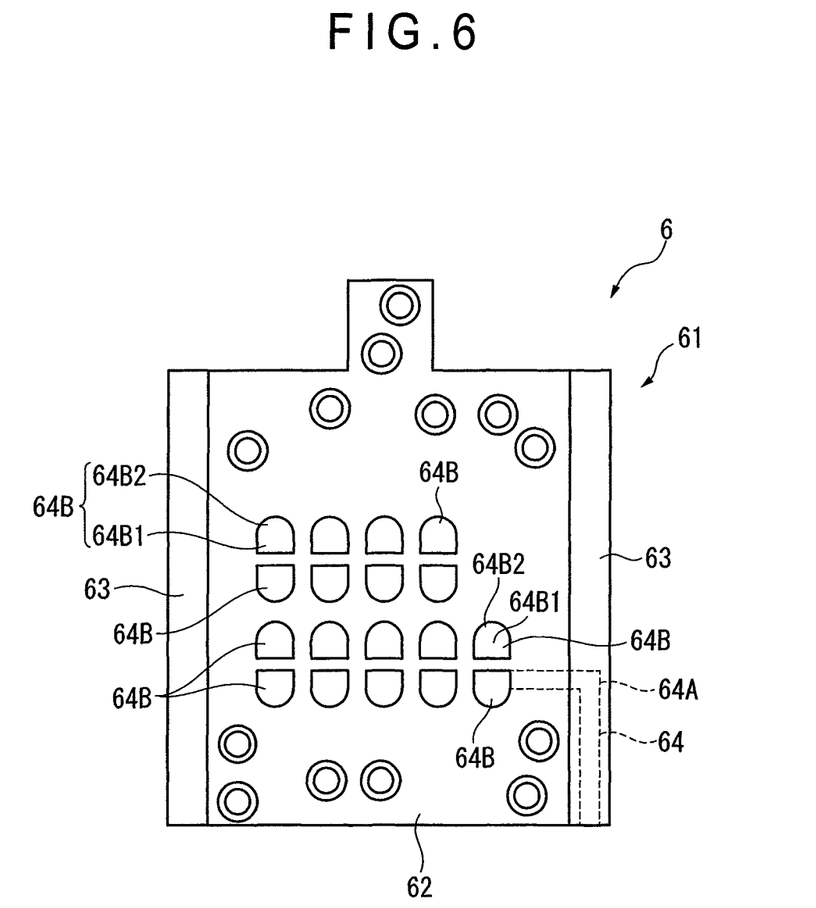
FIG. 6 is another front view of the block of the physical-quantity measuring instrument, for showing an appearance of the block after formation of the electrically-conductive patterns.

FIG. 6 is a front view of the block of the physical-quantity measuring instrument, for showing an appearance of the block after formation of the electrically-conductive patterns.

As shown in FIG. 6, the plurality of electrically-conductive patterns 64 are provided on the block 61 of the synthetic resin body 1. Except the ends of the electrically-conductive patterns 64, i.e., the solder-disposed sections 64B1 and the electronic component-disposed section 64B2, the electrically-conductive patterns 64 are internally formed in the block 61. In FIG. 6, the electrically-conductive patterns 64 are provided on the block 61 in accordance with the number of the electronic components 60 to be mounted. The belt-like portions of the electrically-conductive patterns 64 are not shown, the belt-like portions serving to connect the plurality of electronic components 60 to one another.

A method of internally forming the electrically-conductive patterns 64 (except the ends thereof) in the block 61 is exemplified by an insert molding or an MID (Molded Interconnect Device) molding.

In the insert molding, a synthetic resin material is injected in a mold to form the block 61. For injection-molding the block 61, a metal thin plate used to form the electrically-conductive patterns is disposed in the mold. A covering member is disposed in the mold in advance, the covering member being used to cover portions of the thin plate corresponding to the solder-disposed sections 64B1 and the electronic component-disposed sections 64B2.

In the MID molding, the electrically-conductive patterns 64 are formed in advance by plating a surface of a block body 611 of the block 61 formed by injection molding or the like and then synthetic resin covering pieces 612 are provided on the block body 611 except the ends of the electrically-conductive patterns 64, i.e., portions corresponding to the solder-disposed sections 64B1 and the electronic component-disposed sections 64B2 (see FIG. 5A). The covering pieces 612 may be provided on the block body 611 by any appropriate method, for instance, by spraying a molten resin onto the surface of the block body 611 on which the electrically-conductive patterns 64 are formed.

Figure 7:
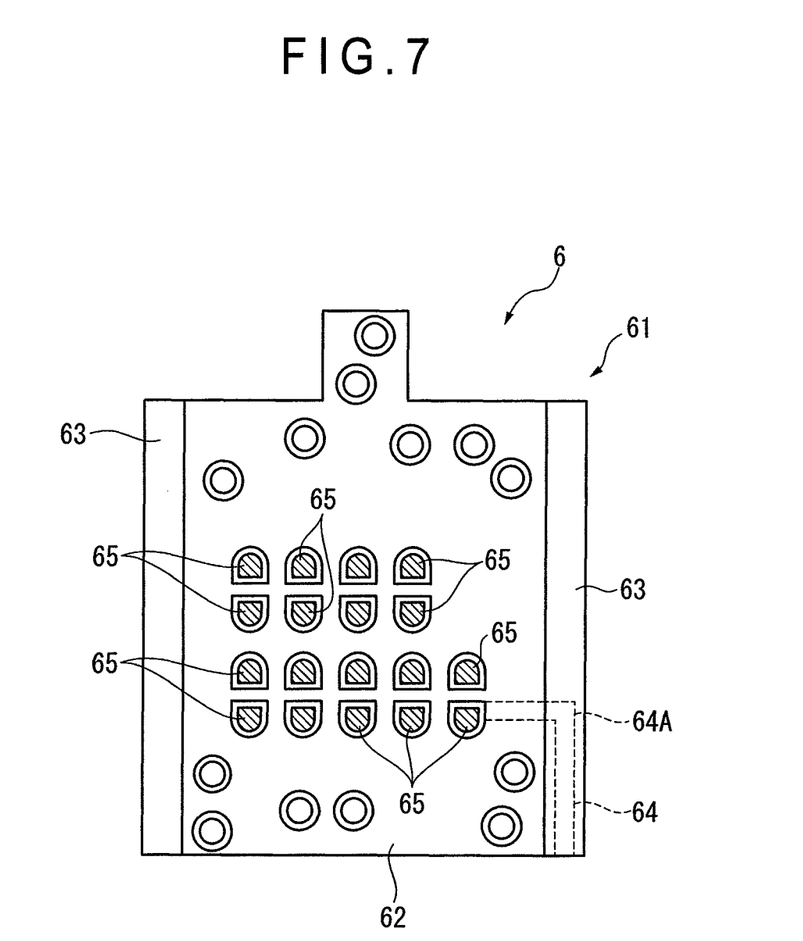
FIG. 7 is still another front view of the block of the physical-quantity measuring instrument, for showing an appearance of the block after a solder is applied to ends of the electrically-conductive patterns.

The block body 611 and the covering pieces 612 in combination provide the block 61 and the belt-like portions 64A of the electrically-conductive patterns 64 are internally formed in the block 61. The covering pieces 612 may be formed from any appropriate synthetic resin material, which is preferably the same synthetic resin as the block body 611. In other words, the entirety of the block 61 is preferably formed from the same insulating synthetic resin. In the exemplary embodiment, the covering pieces 612 may be formed by a molding process in place of the MID molding. In the molding process, using a thermoplastic resin such as a one-pack thermoplastic polyamide resin or a one-pack thermoplastic polyester resin, surfaces of the electrically-conductive patterns 64 of the block body 611 are molded. The molding process may be performed not only on the electrically-conductive patterns 64 but also on the plurality electronic components 60 mounted on the electrically-conductive patterns 64. In other words, the electrically-conductive patterns 64 and the electronic components 60 may be covered by a resin to obtain a predetermined thickness. With such a molding process, since a short-circuit caused by a foreign substance can be avoided, handling during an assembly operation can be facilitated and protection using a case is not required.
Solder Applying Process The solder 65 is applied to the ends of the electrically-conductive patterns 64. FIG. 7 is a front view of the block of the physical-quantity measuring instrument, for showing an appearance of the block after the solder is applied to the ends of the electrically-conductive patterns.

As shown in FIG. 7, the solder 65 is applied to the solder-disposed sections 64B1 of the electrically-conductive patterns 64, which are exposed on the block 61, using a solder applicator (not shown).

The solder applicator may be provided by, for instance, a known device designed to apply a predetermined amount of the solder 65 through a nozzle (not shown).
Electronic Component Mounting Process The electronic components 60 are mounted on the portions where the solder 65 is applied in the solder applying process.

Figure 8:
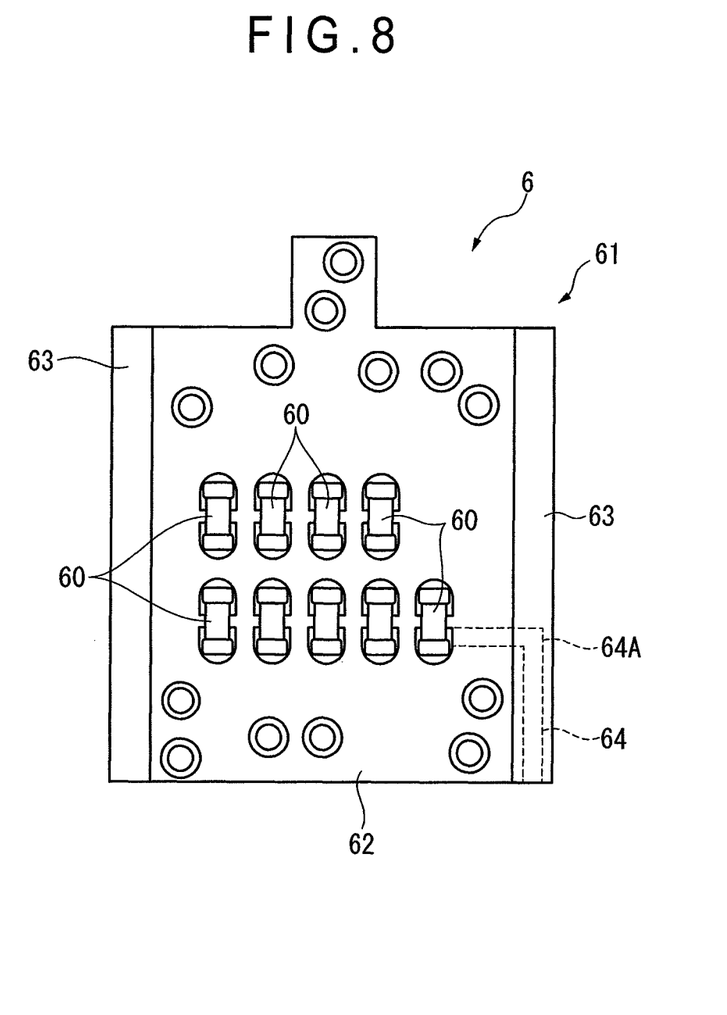
FIG. 8 is further front view of the block of the physical-quantity measuring instrument, for showing an appearance of the block after electronic components are mounted on the ends of the electrically-conductive patterns.

FIG. 8 is a front view of the block of the physical-quantity measuring instrument, for showing an appearance of the block after the electronic components are mounted on the ends of the electrically-conductive patterns.

As shown in FIG. 8, a robot or the like (not shown) is used to mount the electronic components 60 on the ends of the electrically-conductive patterns 64 where the solder 65 is applied. When the electronic components 60 are mounted, the solder 65 is placed at least between the solder-disposed sections 64B1 and the opposed surfaces 60A of the electronic components 60.

Soldering Process

The block 61, on which the electronic components 60 are mounted, is heated by a heater (not shown), thereby melting the solder 65 between the ends of the electrically-conductive patterns 64 and the electronic components 60 for fixation of the electronic components 60.

Assembling of the Instrument

The body 1 including the three-dimensional circuit component 6 is integrally produced. Thus, the electrically-conductive patterns are internally formed not only in the three-dimensional circuit component 6 but also in the cylindrical portion 7 and the contact member housing 8 to produce the body 1.

After producing the body 1, the contact member 4 is inserted into each of the contact member insertion holes 811 of the contact member housing 8 of the body 1 and the linear portion 42 of the contact member 4 is soldered to the pad 820 provided on the step portion 82 of the contact member housing 8

The grounding lead 74 is formed in advance on the outer circumference of the cylindrical portion 7 of the body 1. Using the engagement pins 711, the small-diameter portion 72 of the cylindrical portion 7 is positioned to be fitted in the module housing 2 to which the sensor module 3 is bonded in advance. The electrically-conductive adhesive P is provided in the recess formed between the step 73 of the cylindrical portion 7 and the end surface of the module housing 2, thereby bonding the body 1 to the module housing 2. The outer circumference of the body 1 is covered by the cylindrical case 5. The case 5 and the module housing 2 are, for instance, welded together.

In view of the above, the exemplary embodiment provides the following advantages.

(1) For producing the three-dimensional circuit component 6, the electronic components 60 are mounted on the synthetic resin block 61. The plurality of electrically-conductive patterns 64 used to establish an electrical connection to the electronic components 60 are formed on the block 61 along the three-dimensional shape of the block 61. The ends of the electrically-conductive patterns 64 are provided with the solder-disposed sections 64B1. The solder 65 is provided between the solder-disposed sections 64B1 and the opposed surfaces 60A of the electronic components 60. The sections of the electrically-conductive patterns 64 other than the solder-disposed sections 64B1 and the sections on which the electronic components 60 are mounted are internally formed in the block 61. With the above arrangement, since the sections of the electrically-conductive patterns 64 other than the sections on which the electronic components 60 are mounted are internally formed in the block 61, the electrically-conductive patterns 64 are not unnecessarily exposed. Thus, since a foreign substance is prevented from contacting with adjacent ones of the electrically-conductive patterns 64, a short-circuit and a decrease in withstand voltage can be prevented. Further, the block 61 includes the plate 62 and the ribs 63 and the plurality of electrically-conductive patterns 64 are continuously formed on the plate 62 and the ribs 63, so that even when a foreign substance exists at the corner between the plate 62 and one of the ribs 63, the foreign substance is prevented from contacting with adjacent ones of the electrically-conductive patterns 64.

(2) For producing the three-dimensional circuit component 6, the electrically-conductive patterns 64, except the ends thereof, are internally formed in the block 61 (the three-dimensional circuit forming process), the solder 65 is applied to the ends of the electrically-conductive patterns 64 (the solder applying process), the electronic components 60 are mounted on the solder 65 applied in the solder applying process at the ends of the electrically-conductive patterns 64 (the electronic component mounting process), and the block 61 with the electronic components 60 mounted thereon is heated to melt the solder 65 for fixation of the electronic components 60 (the soldering process). With this arrangement, the three-dimensional circuit component 6 that can provide the above advantages can be produced in a facilitated manner.

(3) When the insert molding is employed for the three-dimensional circuit forming process, the three-dimensional circuit can be formed during production of the block 61, which results in an improved production efficiency and thus in a reduced production time of the three-dimensional circuit component 6.

(4) When the MID molding is employed for the three-dimensional circuit forming process, even complicated electrically-conductive patterns can be formed on the block in a facilitated manner.

(5) The electrically-conductive patterns 64 are formed on the surface of the block body 611 by the MID molding and then the synthetic resin covering pieces 612 are provided on the electrically-conductive patterns 64 except the ends thereof. With this arrangement, after production of the three-dimensional circuit component 6, the covering pieces 612 can serve to prevent a foreign substance from contacting with adjacent ones of the electrically-conductive patterns 64, which results in prevention of a short-circuit.

(6) When the covering pieces 612 are formed from the same synthetic resin material as the block body 611, the covering pieces 612 and the block body 611 can be firmly bonded together, thereby preventing separation of the covering pieces 612 from the block body 611.

(7) The physical-quantity measuring instrument includes: the three-dimensional circuit component 6 that has the opposite first and second ends; the sensor module 3 being provided near the first end of the three-dimensional circuit component 6; and the contact member 4 being provided near the second end of the three-dimensional circuit component 6 for a signal transmission and reception between the electronic components 60 and an external device. The block 61 of the three-dimensional circuit component 6 includes: the plate 62 on which the electronic components 60 are mounted; and the ribs 63 being formed at both sides of the plate 62, respectively. With this arrangement, the plate 62 can be thinned, which results in prevention of an increase in the size of the entirety of the instrument even after the electronic components 60 are mounted on the plate 62. Further, even when the plate 62 is thinned, the strength of the block 61 can be increased with the assistance of the ribs 63 formed on the plate 62. For instance, the ribs 63 can serve to keep the strength against the weight or load of springs of the contact member 4. Further, the electrically-conductive patterns 64 are unexposed. Thus, even when a periphery of the three-dimensional circuit component 6 is covered by the case 5, the block 61 can be placed close to the case 5, so that the physical-quantity measuring instrument can be downsized.

(8) The through holes 62A are formed through the plate 62, so that the electronic components 60 can be mounted on both front and back surfaces of the plate 62 and the electronic components 60 on the front surface can be electrically connected to the electronic components 60 on the back surface through the through holes 62A. In particular, the thinned plate 62 can provide the smaller through holes 62A and thus a pitch of the electrically-conductive patterns 64 can be narrowed.

(9) The contact member 4 includes the coil 41 being brought into contact with the external device. The coil 41 can be extended and compressed, so that the contact member 4 can be stably connected to the external device. Further, since the coil 41 has a resilience, it is not necessary to provide a resilience to a contact portion of the external device to be in contact with the contact member 4.

(10) The contact member housing 8 in which the contact member 4 is enclosed is formed integrally with the three-dimensional circuit component 6. The contact member housing 8 includes the step portion 82 that has the step relative to the flat surface of the plate 62. The flat surface of the step portion 82 is provided with the pad 820 that is electrically connected to the electrically-conductive patterns 64. The linear portion 42, which is formed integrally with the coil 41, is fixed to the pad 820 by soldering. With this arrangement, the contact member 4 can be electrically connected to the pad 820 in a facilitated manner. Further, since the linear portion 42 and the pad 820 are soldered to each other, a contact resistance can be reduced as a system, which results in improvement of a connection reliability.

(11) The physical-quantity measuring instrument includes: the module housing 2 in which the sensor module 3 is enclosed; and the cylindrical portion 7 whose outer circumference is provided with the grounding lead 74. The step 73 is formed on the second end of the large-diameter portion 71 of the cylindrical portion 7. The bonding member is provided in the step 73 to bond the cylindrical portion 7 to the module housing 2. With this arrangement, since the bonding member is provided in the step 73 of the cylindrical portion 7, an overspill of the bonding member can be prevented, which results in facilitating the assembly operation of the instrument. Further, since an additional member is not required for grounding, it is possible to prevent a cost increase or the like resulting from an increase in the number of components.

(12) The electrically-conductive adhesive is used as the bonding member. Since the electrically-conductive adhesive serves not only to bond the cylindrical portion 7 to the module housing 2 but also to electrically connect the grounding lead 74 provided on the cylindrical portion 7 to the metal module housing 2, the number of components can be reduced. In other words, while fixing the members to each other, the electrically-conductive adhesive functions as a case ground.

(13) The plurality of engagement pins 711 are formed on the end surface of the large-diameter portion 71 of the cylindrical portion 7. With the engagement pins 711 engageable with the engaging holes formed on the end surface of the module housing 2, the body 1 and the module housing 2 can be positioned relative to each other in a circumferential direction to be bonded to each other.

Incidentally, the invention is not limited to the embodiment described above, but includes modifications and improvements as long as an object of the invention can be achieved.

For instance, although the physical-quantity measuring instrument is described as an instrument employing the three-dimensional circuit component 6 in the exemplary embodiment, the invention is not limited to the physical-quantity measuring instrument. Even when the invention is applied to the physical-quantity measuring instrument, the physical-quantity measuring instrument is not limited to the pressure measuring instrument but may be, for instance, a temperature measuring instrument.

In the exemplary embodiment, the contact member 4 includes: the coil 41 that contacts with an external device; and the linear portion 42 being formed integrally with the coil 41. However, the contact member 4 of the invention may be provided only by a coil or a linear member. The number of the contact member 4 is not limited to four but may be determined in accordance with a device type.

The step 73 of the cylindrical portion 7 may be omitted. In such an arrangement, the bonding member may be applied on an outer circumference of an abutting portion of the cylindrical portion 7 against the module housing 2.

The bonding member is not limited to the electrically-conductive adhesive but may be an insulating adhesive.

What is claimed is:

1. A physical-quantity measuring instrument comprising:
    a three-dimensional circuit component comprising: a resin block provided with a plate and ribs provided on both sides of the plate; and an electronic component provided on the plate;
    a sensor module provided at a first end of the three-dimensional circuit component and configured to output a signal to the electronic component;
    a contact member provided on a second end of the three-dimensional circuit component and configured to transmit/receive signals between the electronic component and an external device;
    a cylindrical portion connected to the three-dimensional circuit component; and
    a plurality of first electrically-conductive patterns being formed along a three-dimensional shape of the block in order to establish an electrical connection to the electronic component, the first electrically-conductive patterns each having an end that serves as a contact portion opposed to the electronic component to electrically contact with the electronic component, wherein
    a solder is provided between a solder-disposed section provided in the contact portion of each of the first electrically-conductive patterns and a surface of the electronic component opposed to the solder-disposed section,
    a section of each of the first electrically-conductive patterns other than the solder-disposed section and a section on which the electronic component is mounted is internally formed in the block, and
    the first electrically-conductive patterns are connected to a second electrically-conductive pattern provided in the cylindrical portion.

2. A method of making the physical-quantity measuring instrument according to claim 1, the method comprising:
    forming a three-dimensional circuit by internally forming the electrically conductive patterns, except the ends thereof, in the block;
    applying the solder on the ends of the electrically-conductive patterns;

mounting the electronic component on the end of one of the electrically-conductive patterns on which the solder is applied; and soldering the electronic component by heating the block with the electronic component mounted thereon to melt the solder between the end of the one of the electrically-conductive patterns and the electronic component for fixation of the electronic component.

3. The method according to claim 2, wherein an insert molding is used for forming the three-dimensional circuit.

4. The method according to claim 2, wherein during forming the three-dimensional circuit, the block is formed by forming the electrically-conductive patterns on a surface of a resin block body and covering each of the electrically-conductive patterns, except the end thereof, with a resin covering piece.

5. The physical-quantity measuring instrument according to claim 1, wherein the contact member comprises a coil being brought into contact with the external device.

6. A physical-quantity measuring instrument comprising:
a three-dimensional circuit component comprising:
    a resin block;
    an electronic component being mounted on the block;
    a plurality of electrically-conductive patterns being formed along a three-dimensional shape of the block in order to establish an electrical connection to the electronic component, the electrically-conductive patterns each having an end that serves as a contact portion opposed to the electronic component to electrically contact with the electronic component;
    a plate on which the electronic component is mounted; and
    ribs being formed on both sides of the plate,
    wherein a solder is provided between a surface of the electronic component opposed to one of the electrically-conductive patterns and a solder-disposed section provided in the contact portion of each of the electrically-conductive patterns, and
    a section of each of the electrically-conductive patterns other than the solder-disposed section and a section on which the electronic component is mounted is internally formed in the block;
a sensor module that is disposed near a first end of the three-dimensional circuit component and outputs a signal to the electronic component;
a contact member that is disposed near a second end of the three-dimensional circuit component opposite to the first end and enables a signal transmission and reception between the electronic component and an external device, the contact member comprising a coil being brought into contact with the external device; and
a contact member housing that is connected to the second end of the three-dimensional circuit component to enclose the contact member, the contact member housing comprising:

a step portion having a step relative to a flat surface of the plate; and
a pad that is provided on a flat surface of the step portion and is electrically connected to the electrically-conductive patterns, wherein
the contact member further comprises a linear portion that is formed integrally with the coil and is in contact with a flat surface of the pad over a predetermined length, and
the pad and the linear portion are fixed to each other by soldering.

7. A physical-quantity measuring instrument comprising:
a three-dimensional circuit component comprising:
    a resin block;
    an electronic component being mounted on the block;
    a plurality of electrically-conductive patterns being formed along a three-dimensional shape of the block in order to establish an electrical connection to the electronic component, the electrically-conductive patterns each having an end that serves as a contact portion opposed to the electronic component to electrically contact with the electronic component;
    a plate on which the electronic component is mounted; and
    ribs being formed on both sides of the plate,
    wherein a solder is provided between a surface of the electronic component opposed to one of the electrically-conductive patterns and a solder-disposed section provided in the contact portion of each of the electrically-conductive patterns, and
    a section of each of the electrically-conductive patterns other than the solder-disposed section and a section on which the electronic component is mounted is internally formed in the block;
a sensor module that is disposed near a first end of the three-dimensional circuit component and outputs a signal to the electronic component;
a contact member that is disposed near a second end of the three-dimensional circuit component opposite to the first end and enables a signal transmission and reception between the electronic component and an external device;
a metal module housing that encloses the sensor module; and
a cylindrical portion being connected to the module housing, the cylindrical portion being provided with a ground lead formed on an outer circumference thereof, the cylindrical portion being provided with a step formed on an end thereof, wherein the step and the module housing are connected to each other by a bonding member.

* * * * *